(12) United States Patent
Seppala et al.

(10) Patent No.: US 8,155,614 B2
(45) Date of Patent: Apr. 10, 2012

(54) APPARATUS AND METHODS FOR SIGNAL PROCESSING

(75) Inventors: Eira Tuulia Seppala, Helsinki (FI); Vladimir Alexsandrovich Ermolov, Espoo (FI); Pirjo Marjaana Pasanen, Helsinki (FI); Markku Anttoni Oksanen, Helsinki (FI)

(73) Assignee: Nokia Corporation, Espoo (FI)

( * ) Notice: Subject to any disclaimer, the term of this patent is extended or adjusted under 35 U.S.C. 154(b) by 254 days.

(21) Appl. No.: 12/582,294

(22) Filed: Oct. 20, 2009

(65) Prior Publication Data

US 2011/0092247 A1   Apr. 21, 2011

(51) Int. Cl.
*H04B 1/10* (2006.01)

(52) U.S. Cl. ..................................... 455/288; 345/173

(58) Field of Classification Search .............. 455/74, 455/573, 343.1, 354, 282, 288; 345/173, 345/179, 156

See application file for complete search history.

(56) References Cited

U.S. PATENT DOCUMENTS

| | | | |
|---|---|---|---|
| 2,629,827 A | 2/1953 | Eckert, Jr. et al. | |
| 5,205,173 A | 4/1993 | Allen | 73/592 |
| 7,060,350 B2 | 6/2006 | Takaya et al. | 428/323 |
| 7,532,203 B2 * | 5/2009 | Sharma | 345/173 |
| 2004/0007116 A1 | 1/2004 | Marcus | 84/10 |

FOREIGN PATENT DOCUMENTS

| EP | 1 681 687 A1 | 7/2006 |
|---|---|---|
| WO | WO 2006/106458 A1 | 10/2006 |

OTHER PUBLICATIONS

"Tunable Magnetoelastic Phonic Crystals", J.F. Robillard et al, 2009 American Institute of Physics, 3 pages.
"Passive Analogue Filter Development", http://en.wikipedia.org/wiki/Analog_filter, 17 pages.
"Surface Acoustic Wave", http://en.wikipedia.org/wiki/Surface_acoustic_wave, 3 pages.

* cited by examiner

*Primary Examiner* — Tu X Nguyen
(74) *Attorney, Agent, or Firm* — Harrington & Smith (57) ABSTRACT

Apparatus including a matrix; a plurality of magnetic particles distributed in at least a portion of the matrix; the matrix being configured to enable the plurality of magnetic particles to move position relative to one another, and at least a portion of the plurality of magnetic particles being configured to magnetically repel one or more adjacent magnetic particles.

20 Claims, 7 Drawing Sheets

APPARATUS AND METHODS FOR SIGNAL PROCESSING

FIELD OF THE INVENTION

Embodiments of the present invention relate to apparatus and methods for signal processing. In particular, they relate to apparatus and methods for signal processing in a mobile cellular telephone.

BACKGROUND TO THE INVENTION

Devices such as mobile cellular telephones usually include signal processing apparatus (for example, circuitry such as delay lines, memories, correlators and filters) that may provide a variety of functions. For example, a delay line may include a material that converts an electrical signal to an acoustic signal at one end and converts the acoustic signal to an electrical signal at the opposite end. Since the speed of the acoustic wave is slower than the speed of the equivalent electrical signal, a delay is created in the reception of the signal.

In order for such signal processing apparatus to process a signal sufficiently, the circuitry may require a relatively large space in the apparatus. However, in some devices such as mobile cellular telephones, there is currently a desire to reduce the size of the device. The volume required for the signal processing apparatus may result in the device having an undesirable relatively large size.

It would therefore be desirable to provide an alternative apparatus.

BRIEF DESCRIPTION OF VARIOUS EMBODIMENTS OF THE INVENTION

According to various, but not necessarily all, embodiments of the invention there is provided apparatus comprising: a matrix; a plurality of magnetic particles distributed in at least a portion of the matrix; the matrix being configured to enable the plurality of magnetic particles to move position relative to one another, and at least a portion of the plurality of magnetic particles being configured to magnetically repel one or more adjacent magnetic particles.

The matrix may be configured to be substantially elastic. The matrix may have a Young's Modulus of less than 1 GPa. The matrix may have a Young's modulus of less than 0.1 GPa.

The plurality of magnetic particles may be magnetized in substantially the same direction.

The plurality of magnetic particles may be arranged in hexagonal orders.

The apparatus may further comprise an input configured to receive an input signal and provide a force, corresponding to the input signal, to a first portion of the plurality of magnetic particles to cause the first portion of the plurality of magnetic particles to repel one or more adjacent magnetic particles.

The input may comprise an electromagnet that is configured to provide a magnetic force to the first portion of the plurality of magnetic particles.

The apparatus may further comprise an output configured to receive a magnetic field generated by a second portion of the plurality of magnetic particles and provide an output signal corresponding to the received magnetic field.

The apparatus may be configured to receive mechanical forces at the matrix, and the output may be configured to provide an output signal indicative of the received mechanical forces.

The apparatus may further comprise a magnet configured to provide a magnetic field across the plurality of magnetic particles.

The magnet may be configured to provide a variable magnetic field across the plurality of magnetic particles over time.

According to various, but not necessarily all, embodiments of the invention there is provided a device comprising an apparatus as described in any of the preceding paragraphs.

According to various, but not necessarily all, embodiments of the invention there is provided a delay line comprising an apparatus as described in any of the preceding paragraphs.

According to various, but not necessarily all, embodiments of the invention there is provided a module comprising an apparatus as described in any of the preceding paragraphs.

According to various, but not necessarily all, embodiments of the invention there is provided a method comprising: providing a plurality of magnetic particles; and distributing the plurality of magnetic particles in at least a portion of a matrix; the matrix being configured to enable the plurality of magnetic particles to move position relative to one another, and at least a portion of the plurality of magnetic particles being configured to magnetically repel one or more adjacent magnetic particles.

The matrix may be configured to be substantially elastic. The matrix may have a Young's Modulus of less than 1 GPa. The matrix may have a Young's modulus of less than 0.1 GPa.

The plurality of magnetic particles may be magnetized in substantially the same direction. The plurality of magnetic particles may be arranged in hexagonal orders.

The method may further comprise providing an input configured to receive an input signal and provide a force, corresponding to the input signal, to a first portion of the plurality of magnetic particles to cause the first portion of the plurality of magnetic particles to sequentially repel one or more adjacent magnetic particles.

The input may comprise an electromagnet that is configured to provide a magnetic force to the first portion of the plurality of magnetic particles.

The method may further comprise providing an output configured to receive a magnetic field generated by a second portion of the plurality of magnetic particles and provide an output signal corresponding to the received magnetic field.

The method may further comprise configuring the apparatus to receive mechanical forces at the matrix, and the output is configured to provide an output signal indicative of the received mechanical forces.

The method may further comprise providing a magnet configured to provide a magnetic field across the plurality of magnetic particles.

The magnet may be configured to provide a variable magnetic field across the plurality of magnetic particles over time.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

FIGS. 1, 2, 3, 5 and 6 illustrate apparatus 10 comprising: a matrix 16; a plurality of magnetic particles 14 distributed in at least a portion of the matrix 16; the matrix 16 being configured to enable the plurality of magnetic particles 14 to move position relative to one another, and at least a portion of the plurality of magnetic particles 14 being configured to magnetically repel one or more adjacent magnetic particles.

In the following description, the wording 'connect' and 'couple' and their derivatives mean operationally connected/coupled. It should be appreciated that any number or combination of intervening components can exist (including no intervening components). Additionally, it should be appreciated that the connection/coupling may be a physical galvanic connection and/or an electromagnetic connection.

Figure 1:
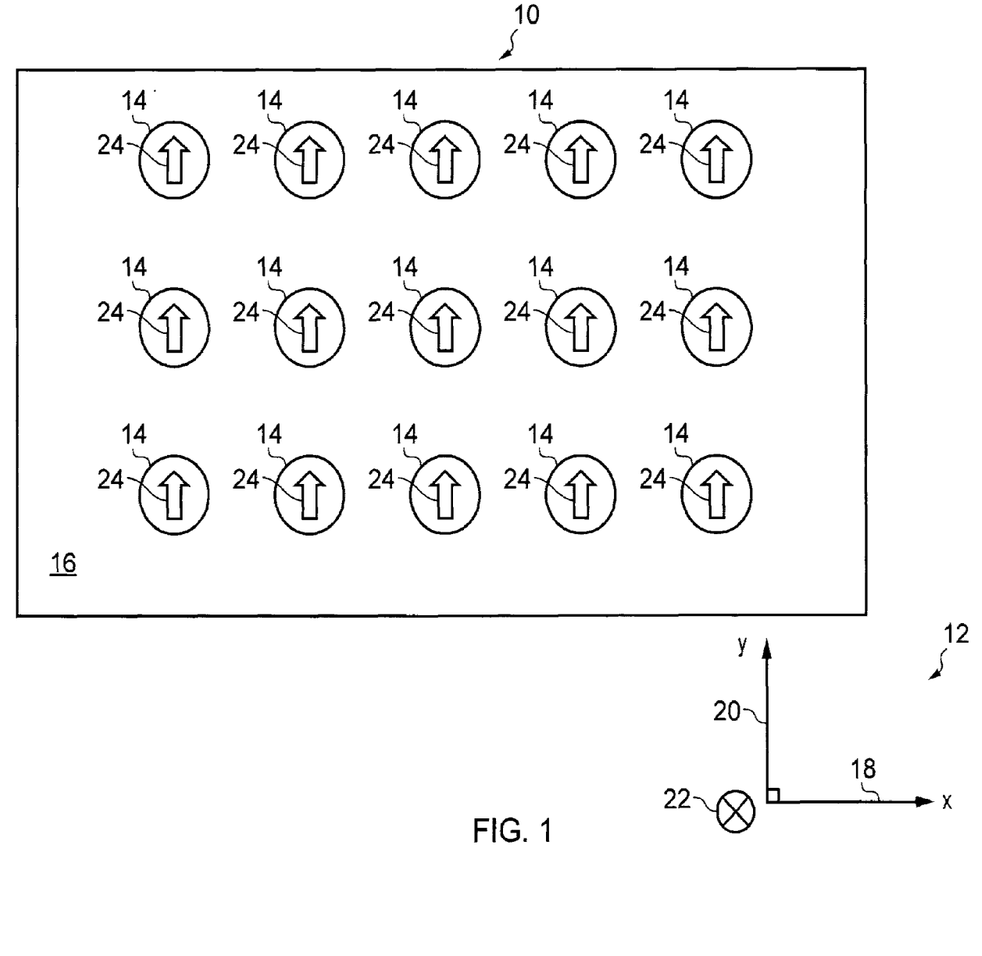
FIG. 1 illustrates a schematic cross sectional view of an apparatus according to various embodiments of the invention.

In more detail, FIG. 1 illustrates a cross sectional view of an apparatus 10 according to various embodiments of the present invention and a Cartesian co-ordinate system 12. The apparatus 10 includes a composite material comprising a plurality of magnetic particles 14 distributed in a matrix 16. The Cartesian co-ordinate system 12 includes an X axis 18, a Y axis 20 and a Z axis 22 which are orthogonal to one another.

It should be appreciated that FIG. 1 illustrates fifteen magnetic particles 14 for exemplary purposes and that apparatus according to embodiments of the invention may include any number of magnetic particles 14. For example, an apparatus may include millions of magnetic particles 14.

The plurality of magnetic particles 14 may comprise any suitable magnetic material and may be ferromagnetic or superparamagnetic. The magnetic particles 14 may each comprise a single crystal or may each comprise a plurality of crystals. The plurality of magnetic particles may comprise, for example, metals such as Iron (Fe), Cobalt (Co) or Nickel (Ni), alloys such as Iron-Platinum alloys (FePt) and oxides such as Magnetite ($Fe_3O_4$). The plurality of magnetic particles 14 may each comprise the same material. Alternatively, the plurality of magnetic particles 14 may include two or more groups of magnetic particles, where each group of particles comprises a different material.

The plurality of magnetic particles 14 may have any suitable shape or combinations of suitable shapes. For example, the plurality of magnetic particles 14 may be spherical, nearly spherical (that is, an Ellipsoid), cylindrical or cuboid for example. The plurality of magnetic particles 14 are substantially the same size as one another and are at least of nanometer size. For example, where the plurality of magnetic particles 14 are spherical in shape, they may have a diameter of at least one nanometer.

Figure 6:
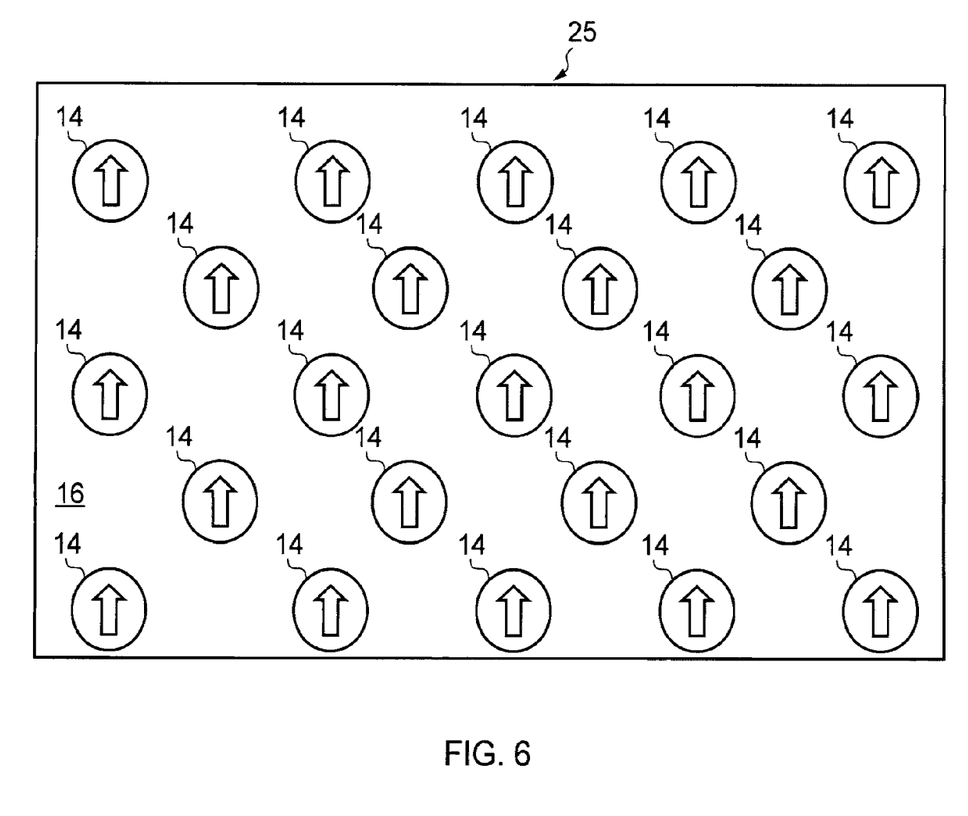
FIG. 6 illustrates a cross sectional view of another apparatus according to various embodiments of the invention.

The plurality of magnetic particles 14 are distributed in the matrix 16 in a structured order and are spaced apart from one so that they do not touch one another. For example, in the case of spherical cobalt magnetic particles having a diameter of ten nanometers, the center to center separation distance between adjacent particles may be twenty nanometers. In this embodiment, the plurality of magnetic particles 14 are positioned adjacent one another to form a plurality of cube shaped arrays. In other embodiments, the plurality of magnetic particles may be positioned adjacent one another in different shaped arrays. For example, FIG. 6 illustrates an apparatus 25 in which the plurality of magnetic particles 14 are arranged in a plurality of hexagonal shaped arrays.

The plurality of magnetic particles 14 may be covered in a shell of surfactant polymer molecules that stabilize the distribution/dispersion of the magnetic particles 14 within the matrix 16. With various surfactants, the interactions between the magnetic particles 14 and the matrix 16 may be controlled. The surfactants may interact with the matrix 16 either by chemical bonding or physical mixing (via van der Waals forces) leading to stable arrays of magnetic particles 14.

It should be appreciated that since the plurality of magnetic particles 14 are positioned adjacent one another, there are attractive and repulsive magnetic forces between adjacent magnetic particles 14. If the magnetic particles 14 are considered as bar magnets, the repulsive force between adjacent particles 14 may be defined by the equation:

$$F = \left[\frac{B_0 A^2 (L^2 + R^2)}{\pi \mu_0 L^2}\right]\left[\frac{1}{x^2} + \frac{1}{(x+2L)^2} - \frac{2}{(x+L)^2}\right] \quad \text{Equation 1}$$

Where $B_0$ is the magnetic flux density close to each pole (in Tesla, T), A is the area of each pole (in meters square), L is the length of each magnet (in meters), R is the radius of each magnet (in meters) and x is the separation between two magnets (in meters).

The plurality of magnetic particles 14 may be magnetized in substantially the same direction and provide substantially the same magnetic field as one another. In FIG. 1, the magnetization direction of the magnetic particles 14 is indicated by the arrows 24 which are oriented parallel to the Y axis 20. The north pole is positioned at the top of the magnetic particles 14 and the south pole is positioned at the bottom of the magnetic particles 14. Consequently, there is an attractive magnetic force between adjacent magnetic particles 14 in the Y axis direction 20 and a repulsive force between adjacent magnetic particles in the X axis direction 18.

The matrix 16 may comprise any suitable material in which the magnetic particles 14 may be embedded and which is configured to allow the magnetic particles 14 to move position relative to one another. That is, the matrix 16 enables the magnetic particles 14 to move so that the distance between the centers of the magnetic particles 14 may increase and decrease. Consequently, the matrix 16 enables the magnetic particles 14 to approach one another and depart from one another. The matrix 16 may include any material that has a relatively low Young's modulus and consequently, the matrix 16 is relatively flexible with low stiffness and is elastic. In some embodiments of the invention, the matrix 16 may have a Young's modulus of less than 1 GPa. In various embodiments of the invention, the matrix 16 may have a Young's modulus of less than 0.1 GPa. By way of example, the matrix 16 may include materials such as styrene-isoprene-styrene (SIS), rubber or any suitable polymer or elastomer. The matrix material may comprise homogeneous material or a combination of several materials. The matrix may also include other functional or structural parts besides the magnetic particles which can affect for example the electrical, structural, mechanical, optical or chemical properties of the material.

Figure 2:
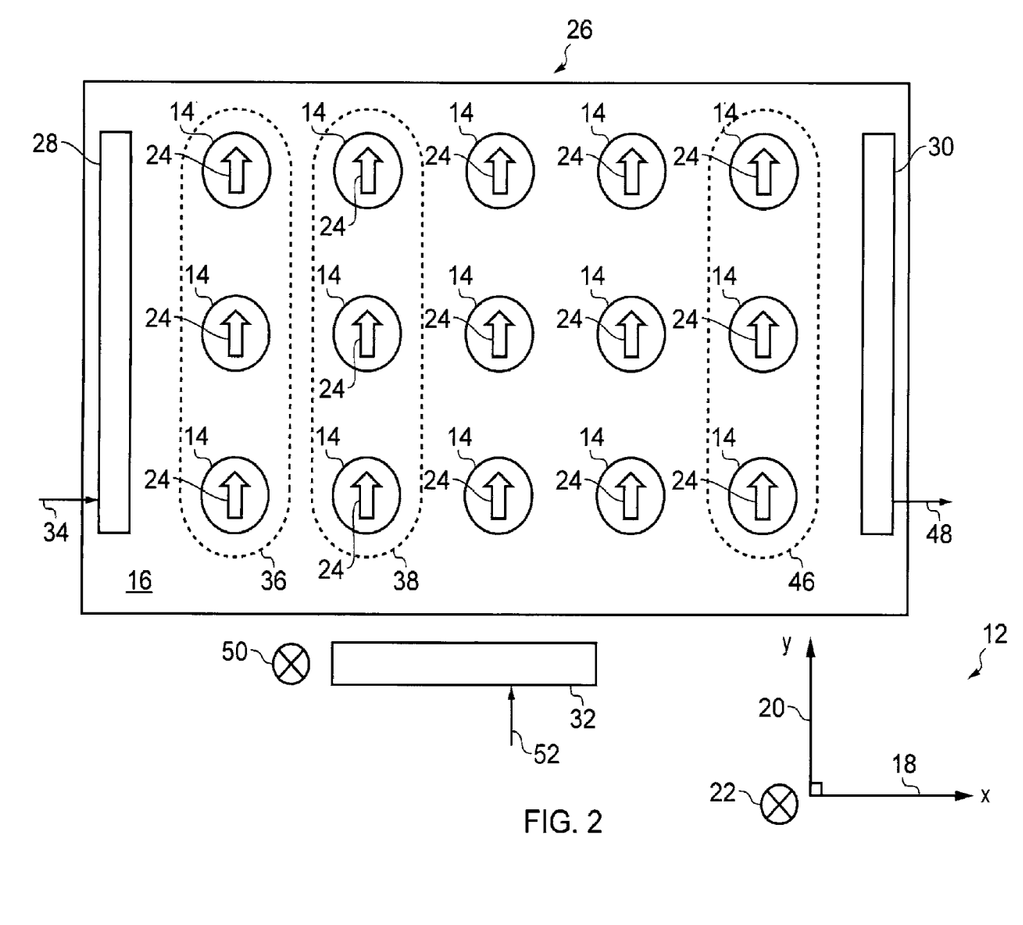
FIG. 2 illustrates a schematic cross sectional view of another apparatus according to various embodiments of the invention.

FIG. 2 illustrates a cross sectional view of another apparatus 26 according to various embodiments of the invention. The apparatus 26 is similar to the apparatus 10 illustrated in FIG. 1 and where the features are similar, the same reference numerals are used. The apparatus 26 differs from the apparatus 10 in that the apparatus 26 additionally includes an input 28, an output 30 and a magnet 32.

The input 28 is configured to receive an input signal 34 and provide a force (corresponding to the input signal) to a first portion 36 of the plurality of magnetic particles 14. In various embodiments, the input 28 is an electromagnet (for example, a single electrode, a meander electrode or a grid type electrode) that converts the input signal 34 to a magnetic field that magnetically repels the first portion 36 of magnetic particles 14. In other embodiments, the input 28 may comprise piezoelectric material that converts the input signal 34 to a mechanical force that repels the first portion 36 of magnetic particles 14.

The force provided by the input 28 to the first portion 36 causes the first portion 36 of magnetic particles 14 to vibrate and move in the +X direction from a stable equilibrium position towards an adjacent portion 38 of magnetic particles 14. As the first portion 36 approaches the adjacent portion 38, the first portion 36 provides a magnetic force to the adjacent portion 38 of magnetic particles 14 that magnetically repels the adjacent portion 38 and causes the adjacent portion 38 to move in the +X direction. This process is then repeated for adjacent portions of the plurality of magnetic particles 14.

Figure 3:
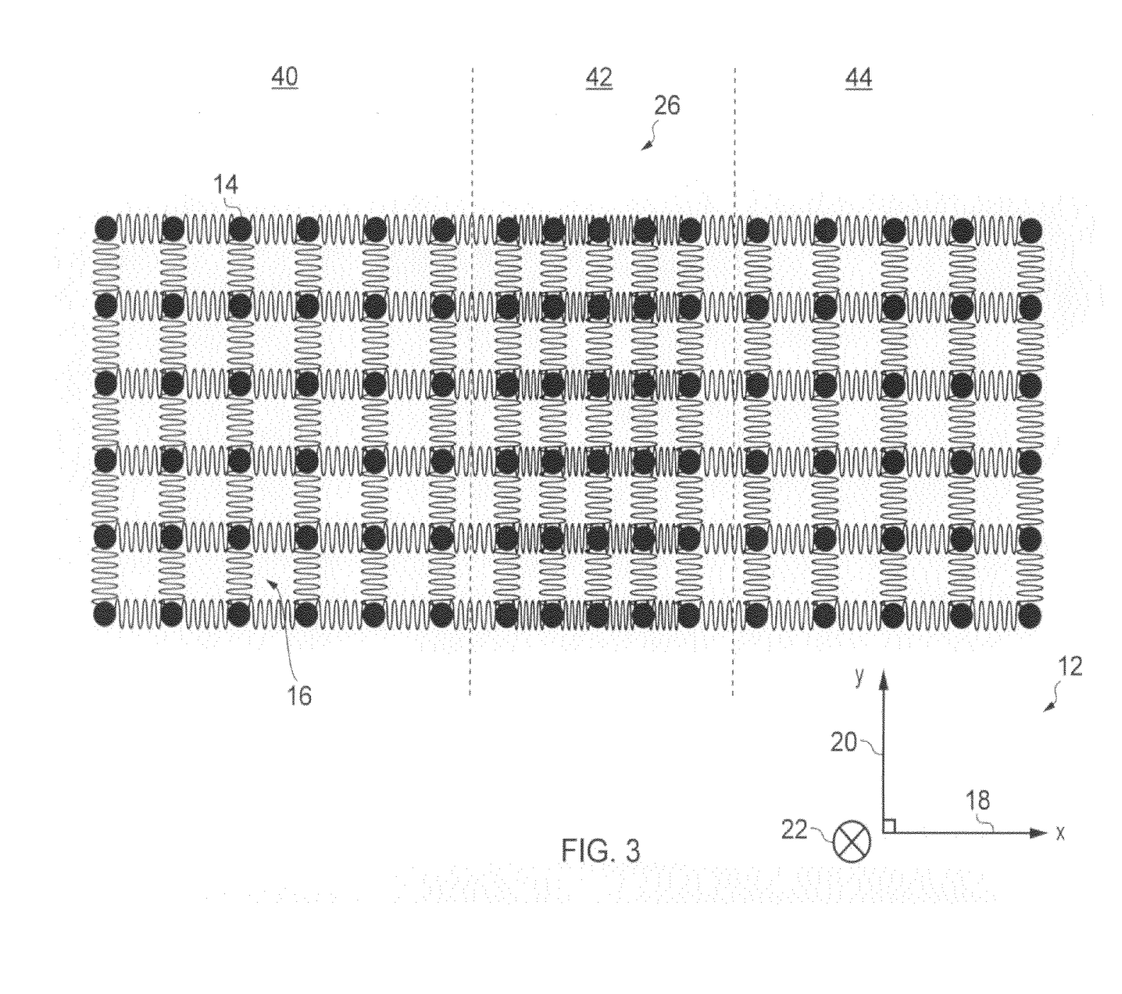
FIG. 3 illustrates a schematic cross sectional view of magnetic particle movement according to various embodiments of the invention.

It should be understood from the above paragraphs that the magnetic particles 14 sequentially repel one another and this may be viewed as a longitudinal wave which travels from the input 28 towards the output 30 over time. FIG. 3 illustrates a cross sectional view of the magnetic particles 14 of the apparatus 26 where such a longitudinal wave is propagating through the apparatus 26. From FIG. 3, it can be seen that the magnetic particles 14 in section 40 have returned to their stable equilibrium position. In section 42, the magnetic particles 14 are in a state of movement (due to magnetic repulsion of one another as explained above) and are positioned in close proximity to one another (that is, they are compressed). In section 44, the magnetic particles are in a stable equilibrium position and have yet to be magnetically repelled by the magnetic particles in section 42.

The group velocity of the wave propagating through the apparatus 26 is defined by the equation:

$$c = a\sqrt{\frac{K}{M}} \qquad \text{Equation 2}$$

Where c is the group velocity, a is the distance between magnetic particles 14, K is the spring constant (a function of the force in equation 1 and the stiffness of the matrix 16) and M is the mass of a magnetic particle 14.

As the longitudinal wave propagates through the apparatus 26, the magnetic repulsion between adjacent magnetic particles 14 causes a second portion 46 of magnetic particles 14 to vibrate and move. The output 30 is configured to receive the changing magnetic field generated by at least the second portion 46 of magnetic particles and provide an output signal 48 that corresponds to the received magnetic field. In some embodiments of the invention, the output 30 is a conductor (a coil of wire, a single electrode, a meander electrode or a grid type electrode for example) in which the magnetic field of the second portion 46 induces a current and which forms the output signal 48. In other embodiments of the invention, the output 30 may comprise piezoelectric material that converts the movement of the second portion 46 into an output signal 48.

The magnet 32 is configured to provide a magnetic field 50 across at least a portion of the magnetic particles 14. The magnet 32 may be a permanent magnet or an electromagnet. From equation 1 above, it should be appreciated that the magnetic repulsion force between magnetic particles 14 is a function of magnetic field. Consequently, the external magnetic field provided by the magnet 32 may be selected to obtain a desired magnetic repulsion force between adjacent magnetic particles 14 and hence a desired group velocity (equation 2) for the wave.

In various embodiments, the magnet 32 is configured to provide a variable magnetic field across the plurality of magnetic particles 14 over time. For example, the magnet 32 may be an electromagnet that is configured to receive a control signal 52 and provide a variable magnetic field 50 (corresponding to the control signal 52) over time. These embodiments may advantageously enable the control and selection of the group velocity (equation 2) for the wave.

Figure 4:
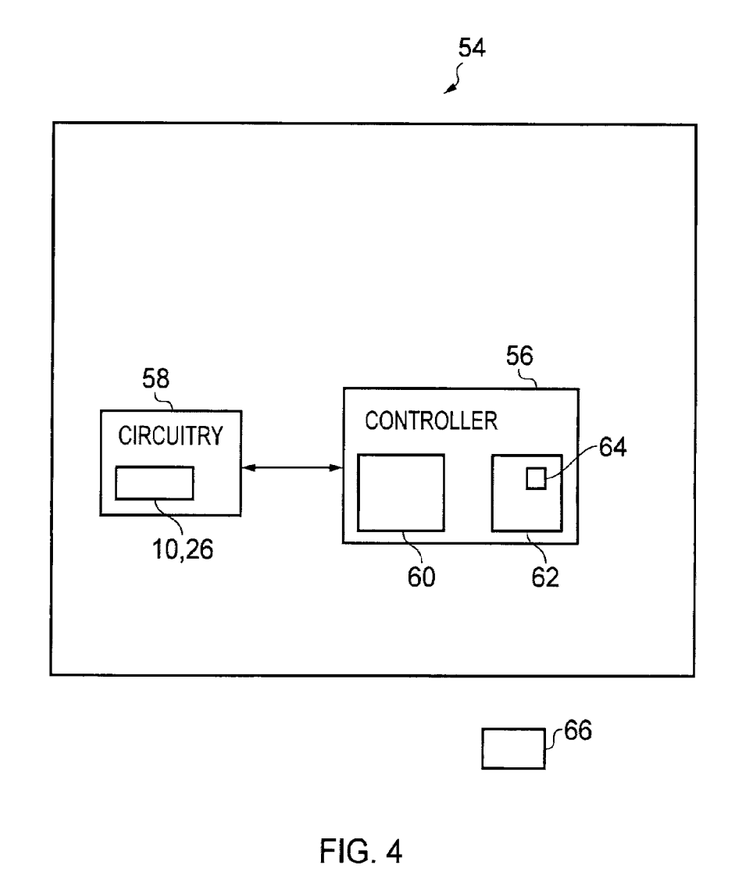
FIG. 4 illustrates a schematic diagram of a device including a further apparatus according to various embodiments of the invention.

FIG. 4 illustrates a schematic diagram of a device 54 according to various embodiments of the invention. The device 54 includes a controller 56 and circuitry 58 that comprises apparatus 10, 25, 26 according to various embodiments of the invention. The device 54 may be a portable communication device such as a mobile cellular telephone, or may be a personal digital assistant, a personal computer or a hand-held computer (a lap top computer for example) or a module for such devices. As used here 'module' refers to a unit or apparatus that excludes certain parts/components that would be added by an end manufacturer or a user.

The implementation of the controller 56 can be in hardware alone (one or more circuits, a processor and so on), have certain aspects in software including firmware alone or can be a combination of hardware and software (including firmware).

The controller 56 may be implemented using instructions that enable hardware functionality, for example, by using executable computer program instructions in a general-purpose or special-purpose processor that may be stored on a computer readable storage medium (disk, memory etc) to be executed by such a processor.

The controller 56 may include a processor 60 and a memory 62. The processor 60 is configured to read from and write to the memory 62. The processor 60 may also comprise an output interface via which data and/or commands are output by the processor 60 and an input interface via which data and/or commands are input to the processor 60.

The memory 62 is configured to store a computer program 64 comprising computer program instructions that control the operation of the device 54 when loaded into the processor. The processor 60 by reading the memory 62 is able to load and execute the computer program 64.

The computer program 64 may arrive at the device 54 via any suitable delivery mechanism 66. The delivery mechanism 66 may be, for example, a computer-readable storage medium, a computer program product, a memory device, a record medium such as a Blue-ray disc, a compact disc (CD-ROM) or a Digital Versatile Disc (DVD), an article of manufacture that tangibly embodies the computer program 64. The delivery mechanism 66 may be a signal configured to reliably transfer the computer program 64. The device 54 may propagate or transmit the computer program 64 as a computer data signal.

Although the memory 62 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The circuitry 58 provides the electronic components of the device 54 and includes one or more apparatus 10, 25, 26 according to various embodiments of the invention. The circuitry 58 may include, for example, a display, an audio output, an audio input, a user input device, radio frequency circuitry and an antenna. The circuitry 58 is configured to receive control signals from the controller 56 and provide signals to the controller 56 for processing. Additionally, the controller 56 may include one or more apparatus 10, 25, 26.

The input signal 34 may be provided to the apparatus 10, 25, 26 by the controller 56 or the circuitry 58. The control signal 52 may be provided to the apparatus 10, 25, 26 by the controller 56 or the circuitry 58. The output signal 48 may be received by the controller 56 or the circuitry 58.

The one or more apparatus 10, 25, 26 may be used for signal processing and may provide, for example, delay lines, memories, correlators, sensors and filters. Where the magnet 32 is configured to provide a variable magnetic field, the apparatus 10, 25, 26 may function as a tunable phase shifter or a tunable oscillator.

Figure 5:
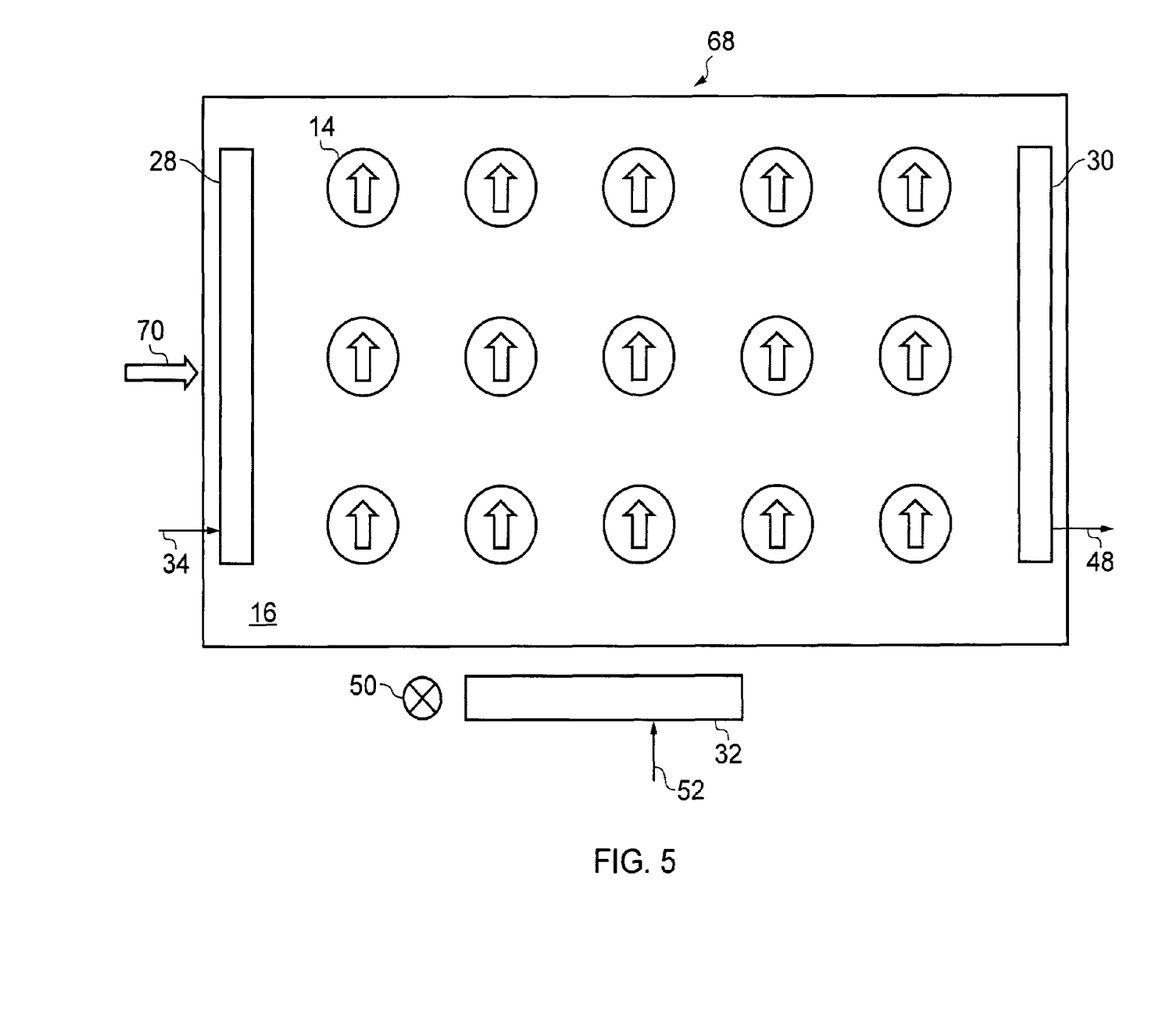
FIG. 5 illustrates a cross sectional view of another apparatus according to various embodiments of the invention.

FIG. 5 illustrates a cross sectional view of another apparatus 68 according to various embodiments of the invention. In these embodiments, the apparatus 68 is a mechanical force sensor that is configured to receive mechanical forces 70 that deform the shape of the matrix 16. For example, the apparatus 68 may be a sensor probe and include a resilient area for receiving a force. The deformation of the matrix 16 may result in the distance between adjacent magnetic particles 14 being changed. Since the group velocity of a wave travelling through the matrix 16 is proportional to the distance between magnetic particles 14, the deformation of the matrix 16 changes the delay provided by the apparatus 68. The controller 56 may access a look-up table (stored in memory 62 for example) to determine the magnitude of the mechanical force 70.

Embodiments of the present invention provide several advantages. One such advantage is that since the magnetic particles 14 are relatively large, the group velocity of a wave propagating through the apparatus 10, 25, 26, 68 may be relatively low. Consequently, the apparatus 10, 25, 26, 68 may provide a relatively large delay for a given length relative to existing signal processing circuitry. This may enable a manufacturer to reduce the size of the apparatus 10, 25, 26, 68 and hence the size of a device 54 including the apparatus. Alternatively, if a manufacturer does not wish to reduce the size of a device, the relatively small size of the apparatus 10, 25, 26, 68 may enable the manufacturer to include further circuitry in the device 54 that provides additional functions. Furthermore, since the apparatus 10, 25, 26, 68 may provide a large delay, a plurality of inputs 28 and a plurality of outputs 30 may be provided on the same substrate.

Another advantage provided by embodiments of the invention is that a manufacturer may relatively easily manufacture the apparatus 10, 25, 26, 68 to have a particular delay. The group velocity of the wave propagating through the apparatus 10, 25, 26, 68 and hence delay may be obtained by selecting a particular magnetic particle 14 size, density and material and by selecting a particular matrix 16 material.

A further advantage provided by various embodiments of the invention is that since the magnetic particles 14 are substantially the same size and have a structured order, the apparatus 10, 25, 26, 68 causes little to no attenuation and distortion of the signal. Furthermore, attenuation and distortion may be reduced by magnetising the magnetic particles 14 in the same direction and by forming them as single crystals.

The hexagonal ordering of the magnetic particles 14 illustrated in FIG. 6 may be advantageous in that it may enable the magnetic particles 14 to be closely packed. Since the group velocity of a wave propagating through an apparatus is proportional to the separation of the magnetic particles 14, hexagonal ordering may provide an apparatus with a larger delay.

Figure 7:
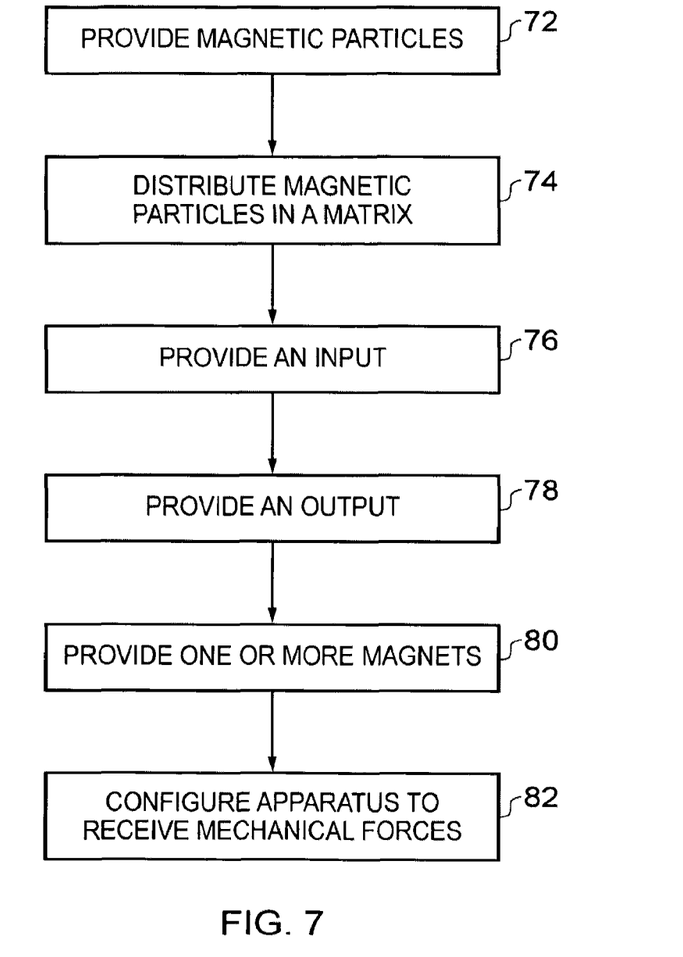
FIG. 7 illustrates a flow diagram of a method of manufacturing an apparatus according to various embodiments of the invention.

FIG. 7 illustrates a flow diagram of a method of manufacturing an apparatus 10, 25, 26, 68 according to various embodiments of the invention. At block 72, the method includes providing a plurality of magnetic particles 14 and mixing the magnetic particles 14 with a solvent such as Toluene. The magnetic particles 14 are then homogenized with a device that provides ultrasonic waves.

At block 74, the method includes distributing the magnetic particles 14 in the matrix 16. The magnetic particles 14 and the matrix 16 are mixed and the solvent may then be removed (by heating above the boiling point of the solvent for example).

At block 76, the method includes providing one or more inputs 28 to the apparatus. At block 78, the method includes providing one or more outputs 30 to the apparatus. At block 80, the method includes providing one or more magnets 32 to the apparatus. Where the apparatus is configured to function as a mechanical force sensor, the method may also include configuring the apparatus to receive mechanical forces at block 82.

The blocks illustrated in the FIG. 7 may represent steps in a method and/or sections of code in one or more computer programs. For example, the method illustrated in FIG. 7 may be performed by an automated robotic system controlled by a processor executing the computer program. The illustration of a particular order to the blocks does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed. For example, the output 30 may detect waves in the apparatus via other physical effects such as the Hall Effect and the Magnetoresistive Effect.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. Apparatus comprising:
   a matrix;
   a plurality of magnetic particles distributed in at least a portion of the matrix; the matrix being configured to enable the plurality of magnetic particles to move position relative to one another, and at least a portion of the plurality of magnetic particles being configured to magnetically repel one or more adjacent magnetic particles;
   where the matrix has a Young's Modulus of less than 1 GPa.

2. Apparatus as claimed in claim 1, wherein the matrix is configured to be substantially elastic.

3. Apparatus as claimed in claim 1, wherein the matrix has a Young's modulus of less than 0.1 GPa.

4. Apparatus as claimed in claim 1, wherein the plurality of magnetic particles are magnetized in substantially the same direction.

5. Apparatus as claimed in claim 1, wherein the plurality of magnetic particles are arranged in hexagonal orders.

6. Apparatus as claimed in claim 1, further comprising an input configured to receive an input signal and provide a force, corresponding to the input signal, to a first portion of the plurality of magnetic particles to cause the first portion of the plurality of magnetic particles to repel one or more adjacent magnetic particles.

7. Apparatus as claimed in claim 6, wherein the input comprises an electromagnet that is configured to provide a magnetic force to the first portion of the plurality of magnetic particles.

8. Apparatus as claimed in claim 1, further comprising an output configured to receive a magnetic field generated by a second portion of the plurality of magnetic particles and provide an output signal corresponding to the received magnetic field.

9. Apparatus as claimed in claim 8, wherein the apparatus is configured to receive mechanical forces at the matrix, and the output is configured to provide an output signal indicative of the received mechanical forces.

10. Apparatus as claimed in claim 1, further comprising a magnet configured to provide a magnetic field across the plurality of magnetic particles.

11. Apparatus as claimed in claim 9, wherein the magnet is configured to provide a variable magnetic field across the plurality of magnetic particles over time.

12. A device, module or delay line comprising an apparatus as claimed in claim 1.

13. A method comprising:
    providing a plurality of magnetic particles; and
    distributing the plurality of magnetic particles in at least a portion of a matrix; the matrix being configured to enable the plurality of magnetic particles to move position relative to one another, and at least a portion of the plurality of magnetic particles being configured to magnetically repel one or more adjacent magnetic particles;
    where the plurality of magnetic particles are arranged in hexagonal orders.

14. A method as claimed in claim 13, wherein the matrix is configured to be substantially elastic.

15. A method as claimed in claim 13, further comprising providing an input configured to receive an input signal and provide a force, corresponding to the input signal, to a first portion of the plurality of magnetic particles to cause the first portion of the plurality of magnetic particles to sequentially repel one or more adjacent magnetic particles.

16. A method as claimed in claim 13, further comprising providing an output configured to receive a magnetic field generated by a second portion of the plurality of magnetic particles and provide an output signal corresponding to the received magnetic field.

17. A method as claimed in claim 16, further comprising configuring the apparatus to receive mechanical forces at the matrix, and the output is configured to provide an output signal indicative of the received mechanical forces.

18. A method as claimed in claim 13, further comprising providing a magnet configured to provide a magnetic field across the plurality of magnetic particles.

19. A method comprising:
    providing a plurality of magnetic particles; and
    distributing the plurality of magnetic particles in at least a portion of a matrix; the matrix having a Young's Modulus of less than 1 GPa and being configured to enable the plurality of magnetic particles to move position relative to one another, and at least a portion of the plurality of magnetic particles being configured to magnetically repel one or more adjacent magnetic particles.

20. The method of claim 19, where the matrix has a Young's modulus of less than 0.1 GPa.

* * * * *